United States Patent
Gorell

(10) Patent No.: US 10,287,857 B2
(45) Date of Patent: May 14, 2019

(54) SYSTEM AND METHOD FOR RESERVOIR SIMULATION OPTIMIZATION

(75) Inventor: Sheldon Gorell, Katy, TX (US)

(73) Assignee: LANDMARK GRAPHICS CORPORATION, Houston, TX (US)

(*) Notice: Subject to any disclaimer, the term of this patent is extended or adjusted under 35 U.S.C. 154(b) by 516 days.

(21) Appl. No.: 14/404,361

(22) PCT Filed: May 30, 2012

(86) PCT No.: PCT/US2012/039998
§ 371 (c)(1),
(2), (4) Date: Nov. 26, 2014

(87) PCT Pub. No.: WO2013/180705
PCT Pub. Date: Dec. 5, 2013

(65) Prior Publication Data
US 2015/0149140 A1    May 28, 2015

(51) Int. Cl.
*E21B 43/00* (2006.01)
*E21B 49/00* (2006.01)
(Continued)

(52) U.S. Cl.
CPC .............. *E21B 43/00* (2013.01); *E21B 49/00* (2013.01); *G01V 99/005* (2013.01); *G06F 17/5009* (2013.01)

(58) Field of Classification Search
CPC ...... E21B 43/00; E21B 49/00; G06F 17/5009; G01V 99/005
(Continued)

(56) References Cited

U.S. PATENT DOCUMENTS

| 5,363,094 A | 11/1994 | Staron et al. |
| 6,018,497 A | 1/2000 | Gunasekera |

(Continued)

FOREIGN PATENT DOCUMENTS

| WO | WO 2004/063769 A2 | 7/2004 |
| WO | WO 2008/150877 A1 | 12/2008 |

(Continued)

OTHER PUBLICATIONS

Patent Examination Report dated Feb. 1, 2016 for Australian Patent Application No. 2012381103, 4 pages.

(Continued)

*Primary Examiner* — Rehana Perveen
*Assistant Examiner* — Justin C Mikowski

(57) ABSTRACT

A method of solving a optimization problem is described. The method includes creating an initial model having a plurality of wells, each well being associated with a parameter and dividing the well field into first and second regions, the first region including a first subset of the plurality of wells and the second region including a second subset of the plurality of wells. The method also includes solving for the parameters associated with the wells in the first subset to get a first set of values while holding constant the parameters associated with the wells in the second subset, setting the parameters associated with the wells in the first subset to the first set of values, and solving for the parameters associated with the wells in the second subset to get a second set of values while holding constant the parameters associated with the wells in the first subset.

24 Claims, 12 Drawing Sheets

(51) Int. Cl.
*G01V 99/00* (2009.01)
*G06F 17/50* (2006.01)

(58) Field of Classification Search
USPC .......................................................... 703/10
See application file for complete search history.

(56) References Cited

U.S. PATENT DOCUMENTS

| | | | |
|---|---|---|---|
| 6,549,879 B1 | 4/2003 | Cullick et al. | |
| 7,478,024 B2 | 1/2009 | Gurpinar et al. | |
| 7,684,929 B2 | 3/2010 | Prange et al. | |
| 8,160,988 B1 | 4/2012 | Owen et al. | |
| 8,423,337 B2 * | 4/2013 | Hsu | G01V 11/00 166/250.01 |
| 8,433,551 B2 * | 4/2013 | Fung | E21B 43/00 324/325 |
| 2010/0179797 A1 | 7/2010 | Cullick et al. | |
| 2011/0024126 A1 | 2/2011 | Brouwer | |

FOREIGN PATENT DOCUMENTS

| | | |
|---|---|---|
| WO | WO 2009/075945 A1 | 6/2009 |
| WO | WO 2012/015515 A1 | 2/2012 |
| WO | WO 2012/033650 A2 | 3/2012 |

OTHER PUBLICATIONS

European Extended Search Report issued for EP 12877961.8, dated Jun. 29, 2016, 8 pages.
Matossian et al. "Autonomic oil reservoir optimization on the Grid." in Concurrency and compulutation: Practice and Experience, vol. 7, No. 1, pp. 1-26 [online]. Published Nov. 29, 2004. [retrieved on Jul. 19, 2012] Retrieved from the Internet <URL: http://www.math.oregonstate.edu/files/math/paper11_M_eta105.pdf> entire document, especially Abstract; pp. 1-6, 11, 13, 22, 25.
International Search Report and Written Opinion of the International Searching Authority for corresponding PCT/US2012/039998 dated Aug. 10, 2012 (6 pages).
Search Report Issued for Russian Patent Application No. 2014118158, 2 pages.

* cited by examiner

__US 10,287,857 B2__

SYSTEM AND METHOD FOR RESERVOIR SIMULATION OPTIMIZATION

CROSS REFERENCE TO RELATED APPLICATIONS

The present application is a U.S. National Stage patent application of International Patent Application No. PCT/US2012/039998, filed on May 30, 2012, the benefit of which is claimed and the disclosure of which is incorporated herein by reference in its entirety.

BACKGROUND

Reservoir simulation is an area of reservoir engineering that employs computer models to predict the transport of fluids, such as petroleum, water, and gas, within a reservoir. Reservoir simulators are used by petroleum producers in determining how best to develop new fields, as well as generate production forecasts on which investment decisions can be based in connection with developed fields.

In oil and gas reservoir simulation, a common task is to optimize a specific parameter for every well in a field (i.e., optimization at the "field level"). For example, such a task may be determining where to place each well within the field or changing reservoir simulation properties near each well so the simulated well matches historical data recorded about the well ("historical matching"). Often, these simulations employ brute force methods that attempt to optimize the parameter for all the wells in the field simultaneously, despite the fact that the parameter may be spatially dependent (i.e., changing a property of one well will affect a nearby well but will have little to no effect at a far away well). Solving for spatially-dependent parameters at a field level simultaneously may result in computational inefficiencies and a failure to fully optimize a reservoir model.

Thus, although existing approaches to reservoir simulation have been satisfactory for their intended purposes, they have not been entirely satisfactory in all respects.

BRIEF DESCRIPTION OF THE DRAWINGS

A more complete understanding of the present disclosure and advantages thereof may be acquired by referring to the following description taken in conjunction with the accompanying figures, wherein.

DETAILED DESCRIPTION

To overcome the above-noted and other limitations of the current approaches, embodiments described herein comprise methods and systems for reservoir simulation optimization.

Figure 1:
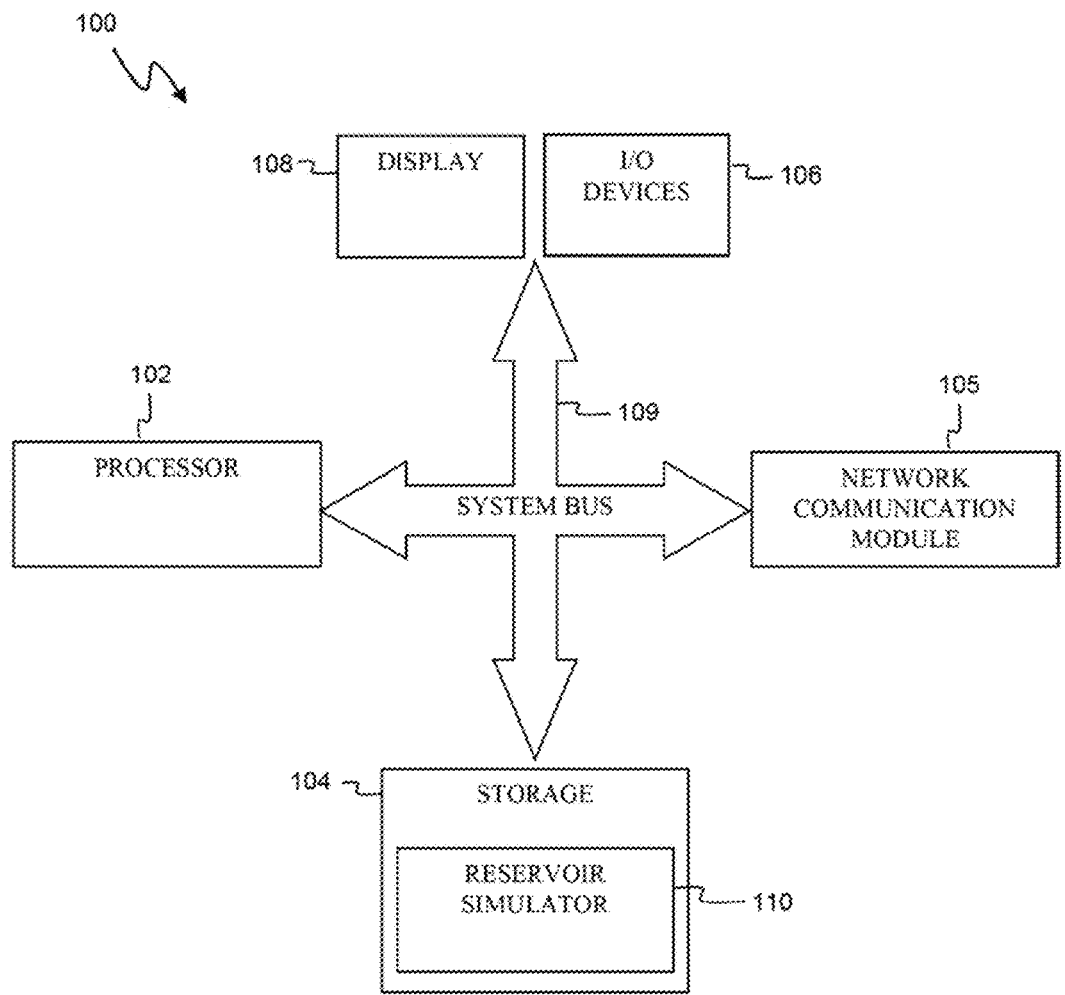
FIG. 1 is a block diagram of a computer system adapted for implementing a reservoir simulation system of exemplary embodiments.

FIG. 1 is a block diagram of an exemplary computer system 100 adapted for implementing the reservoir simulation system as described herein. In one embodiment, the computer system 100 includes at least one processor 102, a non-transitory, computer-readable storage 104, a network communication module 105, optional I/O devices 106, and an optional display 108, and all interconnected via a system bus 109. The network communication module 105 is operable to communicatively couple the computer system 100 to other devices over a network. In one embodiment, the network communication module 105 is a network interface card (NIC) and communicates using the Ethernet protocol. In other embodiment, the network communication module 105 may be another type of communication interface such as a fiber optic interface and may communicate using a number of different communication protocols. It is recognized that the computer system 100 may be connected to one or more public (e.g. the Internet) and/or private networks (not shown) via the network communication module 105. Such networks may include, for example, servers upon which reservoir data is stored. Software instructions executable by the processor 102 for implementing a reservoir simulator 110 in accordance with the embodiments described herein, may be stored in storage 104. It will also be recognized that the software instructions comprising the reservoir simulator 110 may be loaded into storage 104 from a CD-ROM or other appropriate storage media.

In one embodiment of the disclosure, a portion of the reservoir simulator 110 is implemented using reservoir simulation software known in the art. Such reservoir simulation software typically utilizes numerical representations of the reservoir, either as the reservoir currently exists or as it is envisioned to exist at some point in the future, such as before any wells are drilled and prior to any field development. This representation of the reservoir combined with additional data about proposed or existing wells and development strategy allows the software to predict how the reservoir might perform in terms of fluid injection and production.

In reservoir simulation, a typical goal is to optimize an objective function at a field level. In other words, reservoir simulators, such as reservoir simulator 110, are employed to determine optimal values for a specific parameter that is associated with every well in a well field. For example, the reservoir simulator 110 may be used to geographically place each well in the field in a way that maximizes recovery of hydrocarbons, or it may be used to alter a simulation parameter, such as porosity, in the vicinity of each well such that simulation results match historical injection and production results (i.e., history matching). A typical simulation process for full field optimization may employ a brute force method. That is, a reservoir simulator may optimize the selected parameter for every well simultaneously. However, if there are a significant number of wells in a field, then the range of possible outcomes may be extremely large and results may not be optimal.

Often, the well-centric parameters solved for in full field simulations are spatially dependent. In other words, altering a spatially-dependent parameter associated with one well will affect a nearby well to a greater degree than a distant well. And, if two wells are far enough apart, a change at one will have virtually no effect on the other. Certain embodiments of the present disclosure, as described in more detail below, provide for a method and system for reservoir simulation that accounts for the spatially dependent nature of full field optimization. Specifically, in one embodiment, a reservoir simulator may subdivide spatially-dependent, field optimization problems into a sequential series of smaller optimization problems that are applied to only a subset of the wells in a field. That is, it may break a well field into a number of regions and solve for selected parameter for the wells in a single region, while freezing the parameters associated with the wells in the other regions. The newly solved-for parameters are set for the first region, and the process is sequentially repeated through the regions until all regions have been optimized. In certain embodiments, after all regions have been solved for, the optimized results may be used for a final full field optimization. In this manner, reservoir simulations may more effectively solve spatially-dependent, field optimization problems. The reservoir simulator 110 in the computer system 100 may implement this method and other methods contemplated by the embodiment.

Figure 2:
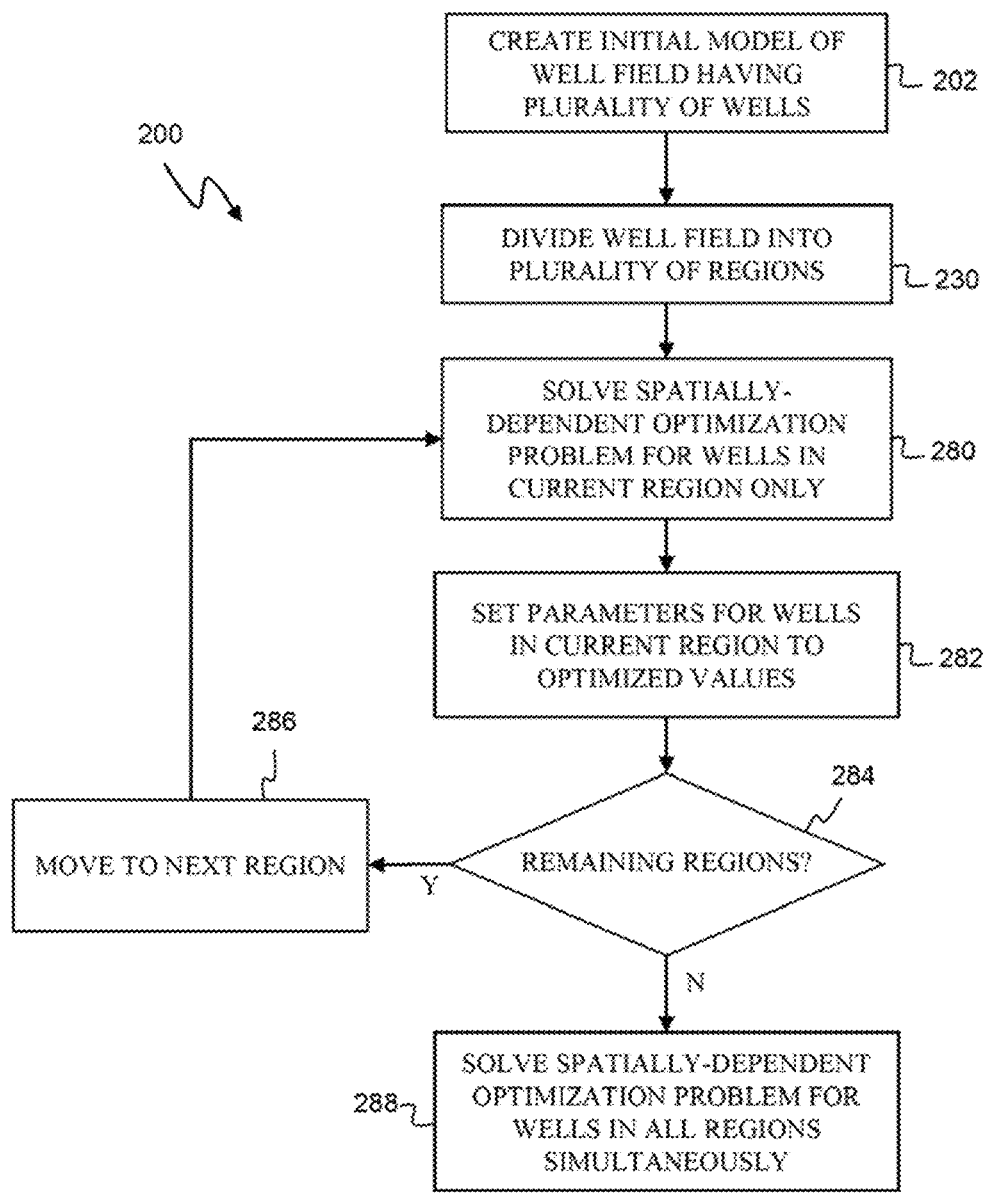
FIG. 2 is a flowchart illustrating a method for optimizing spatially-dependent well-field attributes in a reservoir simulation according to aspects of the present disclosure.

FIG. 2 is a flowchart illustrating a method 200 for optimizing spatially-dependent well-field parameters in a reservoir simulation according to aspects of the present disclosure. In one embodiment, the method 200 may be implemented by the reservoir simulator 110 in the computer system 100 of FIG. 1. Further, the method 200 in FIG. 2 is a high-level overview and details associated with each block of the method will be described in association with the subsequent figures in the present disclosure.

The method 200 begins at block 202 where an initial model of a reservoir is created for the reservoir simulator 110. In certain embodiments, a reservoir model may implemented using a number of discretized blocks, referred to interchangeably herein as "blocks," "grid blocks," or "cells." Models can vary in size from a few blocks to hundreds of millions of blocks. In these software simulations, it is common to model a reservoir using a grid formed of grid blocks and then simulate reservoir properties (e.g., pressure, temperature) within each grid block to predict flow of hydrocarbons and ultimately, recovery of hydrocarbons through wells. For example, such modeling is particularly useful in reservoirs for determining how many and where wells should be placed in a reservoir to achieve a certain recovery over a period of time.

Figure 3:
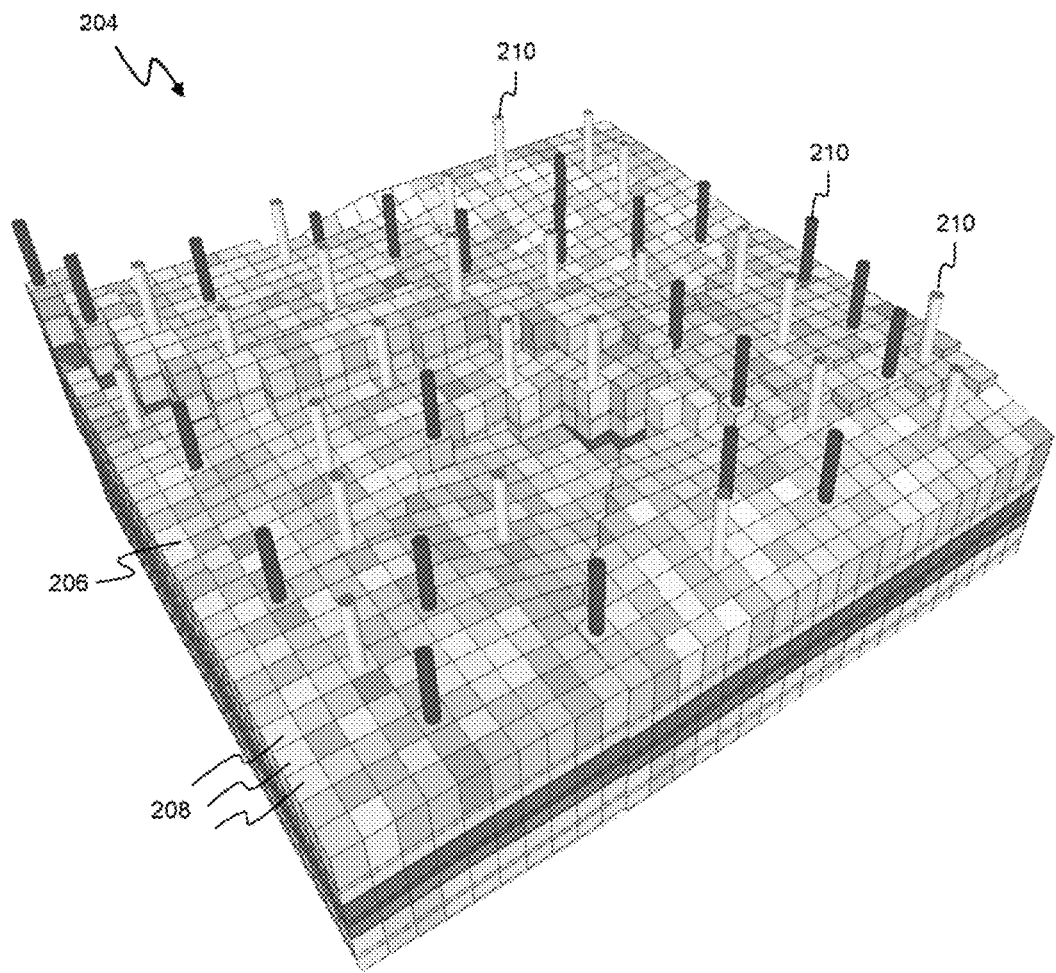
FIG. 3 is a three-dimensional view of an initial model of a reservoir having a plurality of wells.

In that regard, FIG. 3 illustrates a three-dimensional view of an initial model 204 of a reservoir having a well field 206. The initial model 204 is comprised of a plurality of grid blocks 208 that discretely characterize a portion of the modeled reservoir. In other embodiments, the initial model of a reservoir may be characterized by other modeling techniques known in the art. For purposes of the description of the invention, "initial model" shall mean a model of a reservoir that is based on parameters that are assigned values by some default process and that have not been subjected to optimization processes. For example, in the illustrated example of FIG. 3, the well field 206 includes a plurality of wells 210. The initial model 206 includes a number of parameters associated with each well that are set to default values during creation of the initial model. Included in these parameters are spatially-dependent parameters (i.e., parameters that when changed at one well affect similar parameters at other wells). Spatially-dependent parameters associated with the wells in initial model 204 may include geographic well placement, well operational properties, and attributes of the reservoir in the vicinity of the well such as permeability, porosity, pressure, hydrocarbon flow rate, water flow rate, or other attributes that are affected by changes at nearby wells.

When solving an optimization problem with an objective function, such as maximizing hydrocarbon recovery from a reservoir, the reservoir simulator 110 may alter the value of one of these parameters at each well over the course of multiple simulation iterations until values are found that satisfy the objective function. The greater the number of wells in the simulation, the greater the number of parameters the simulator must solve for during each iteration and the greater the computational complexity. Thus, an optimization problem in which well placement (i.e., a spatially-dependent parameter) is iteratively solved for until recovery is maximized is exponentially more computationally complex with a large number of wells versus a small number of wells. As will be described in more detail below, the method 200 starts with the initial model 204 and subdivides it into smaller regions of fewer number of wells to reduce the complexity and increase the optimization of spatially-dependent parameters.

Figure 4:
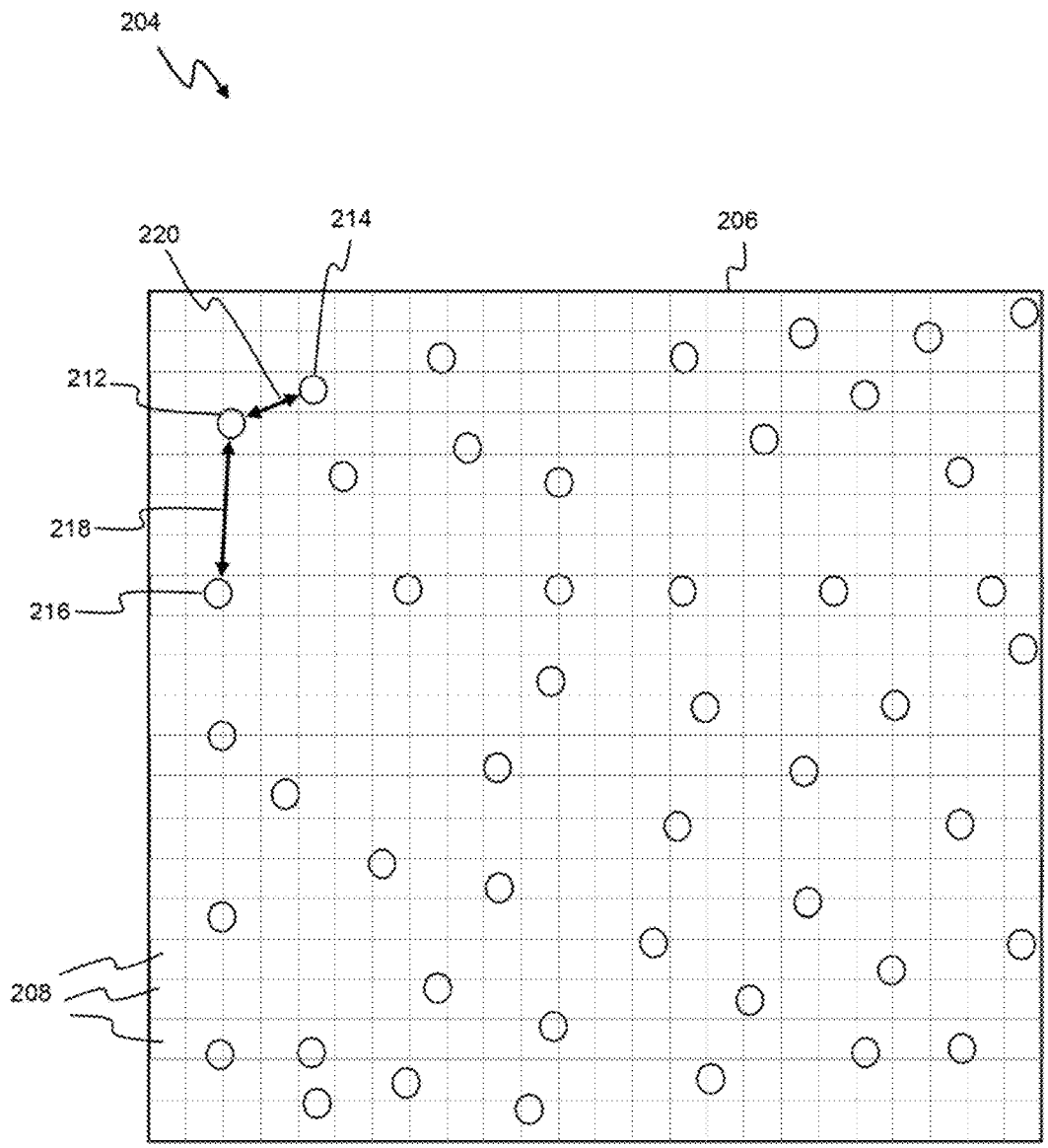
FIG. 4 illustrates a top view of the initial model of FIG. 3 showing initial placement of wells in a well field.

Referring to FIG. 3, as part of the creation of the initial model 204 in block 202 of method 200, the reservoir simulator 110 places the wells 210 at initial—or default—geographic positions within the well field 206. In certain embodiments, the wells 204 are initially placed using an algorithm that positions wells in areas of the well field that are characterized by relatively high porosity and permeability. This initial placement may be subject to some minimum spacing requirement between wells. In this regard, FIG. 4 illustrates a top view of the initial model 204 showing initial placement of wells, including wells 212, 214, and 216, in well field 206. As shown in FIG. 4, the wells 212, 214, and 216 are placed in default positions such that distances 218 and 220 are greater than a minimum threshold distance. In alternative embodiments, the initial model of a reservoir including well placement may be created in different manner, such as by algorithm based upon historical data or by random well placement.

Referring back FIG. 2, after an initial model of a reservoir has been created, the method 200 proceeds to block 230 where the well field 206 is divided into a plurality of regions. Each region includes a subset of the total number of wells in the well field. In general, a well field may be divided into regions for optimization purposes based upon the notion that a change to a spatially-dependent parameter associated with a well—such as well placement—has some impact on nearby wells but virtually no impact on relatively far away wells. Thus, each region created in block 230 generally contains a subset of wells that affect each other when modified but have little or no effect on wells in other regions when modified. Accordingly, when solving a full field optimization problem, the reservoir simulator 110 may iteratively adjust a parameter of the wells in one region without making changes in wells in other regions. This concept serves as the basis for the sequential optimization process described in the remainder of the steps in method 200.

The reservoir simulator 110 may divide the well field into regions in any number of different manners based upon the number of wells in a field and the spatially-dependent parameter being optimized during the optimization process. For example, a well field may be divided up one way when solving for a first spatially-dependent parameter but another way for a second spatially-dependent parameter if a change in the second parameter affects other wells to a greater degree than a change in the first parameter. Thus, in certain embodiments, if a parameter is highly spatially-dependent, the reservoir simulator 110 may divide a well field into regions containing a large number of wells. The division of a well field into regions also depends on the number of parameters that may be simultaneously solved for in an efficient manner. The greater the computational power available, the greater number of wells may be included in a region. In other embodiments, the reservoir simulator may taking into account any number of additional and/or different factors when dividing the well field into regions.

Figure 5:
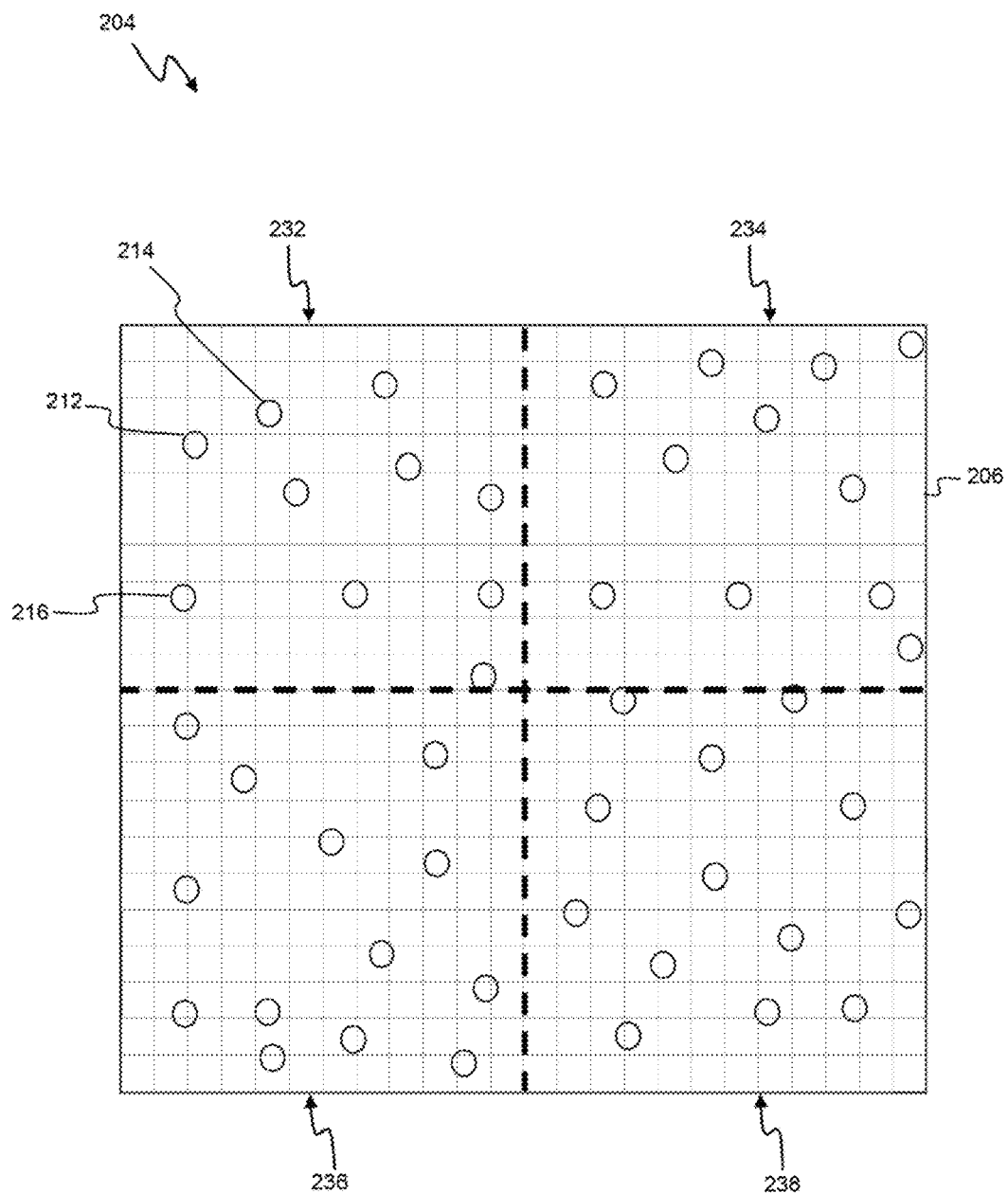
FIGS. 5-8 are top views of the initial model of FIG. 3 where the well field has been divided into regions according to different embodiments of the present disclosure.
Figure 6:
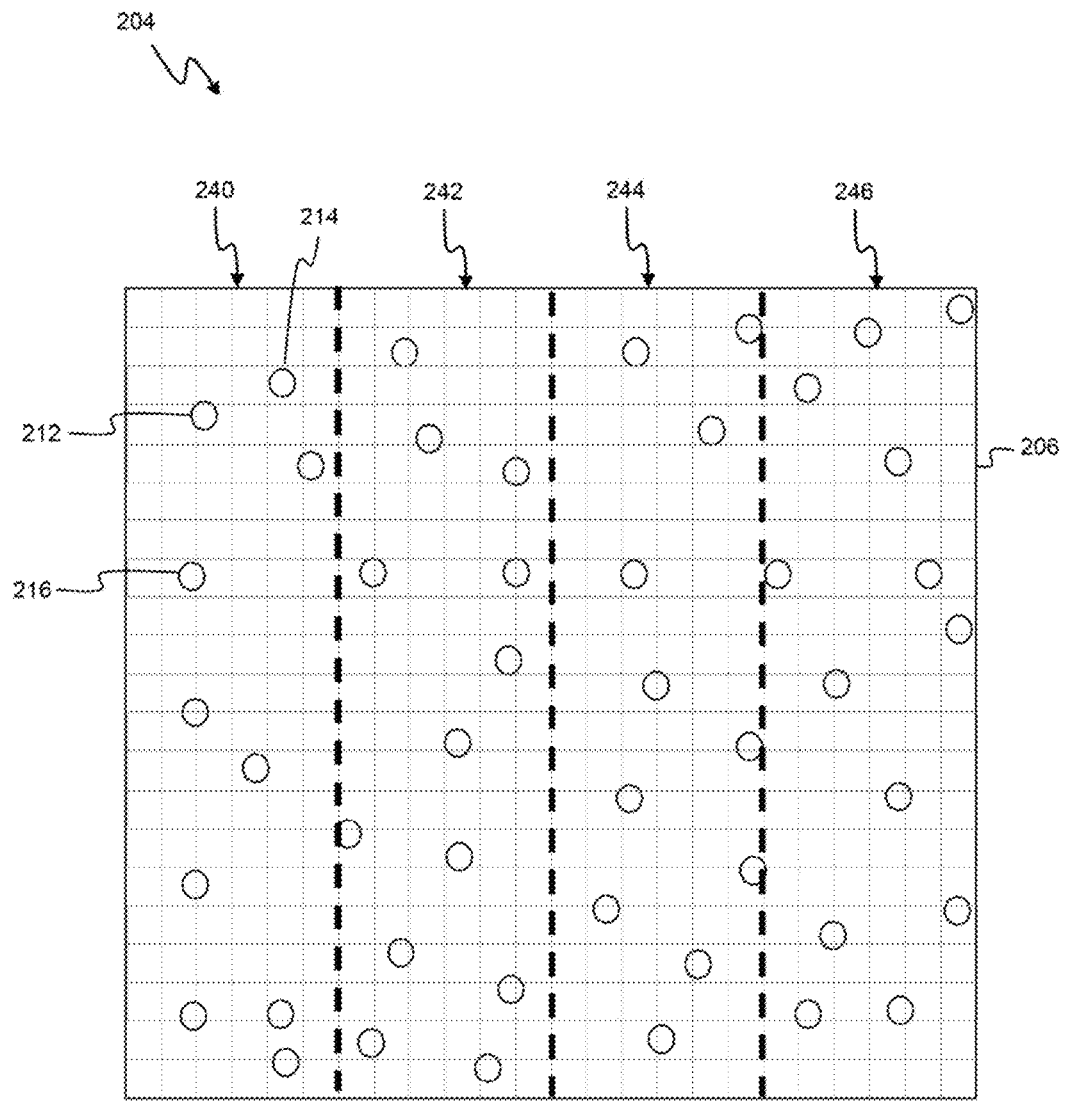

Further, reservoir simulator 110 may divide a well field into any number of differently shaped and sized regions. For instance, FIG. 5 is a top view of the initial model 204 where the well field 206 that has been divided into four regions 232, 234, 236, and 238. The regions 232, 234, 236, and 238 encompass approximately square quadrants of the well field and each contains a subset of the total number of wells. For instance, the region 232 includes the wells 212, 214, and 216. As another example, FIG. 6 is a top view of the initial model 204 where the well field 206 has been divided into four regions 240, 242, 244, 246. The regions 240, 242, 244, 246 are approximately rectangular in shape and subdivide the well field 206 into parallel strips. Notably, in certain embodiments, changing a spatially-dependent parameter associated with well 212 in region 240 is likely to have negligible impact on any of the wells in non-contiguous regions such as region 246.

Figure 7:
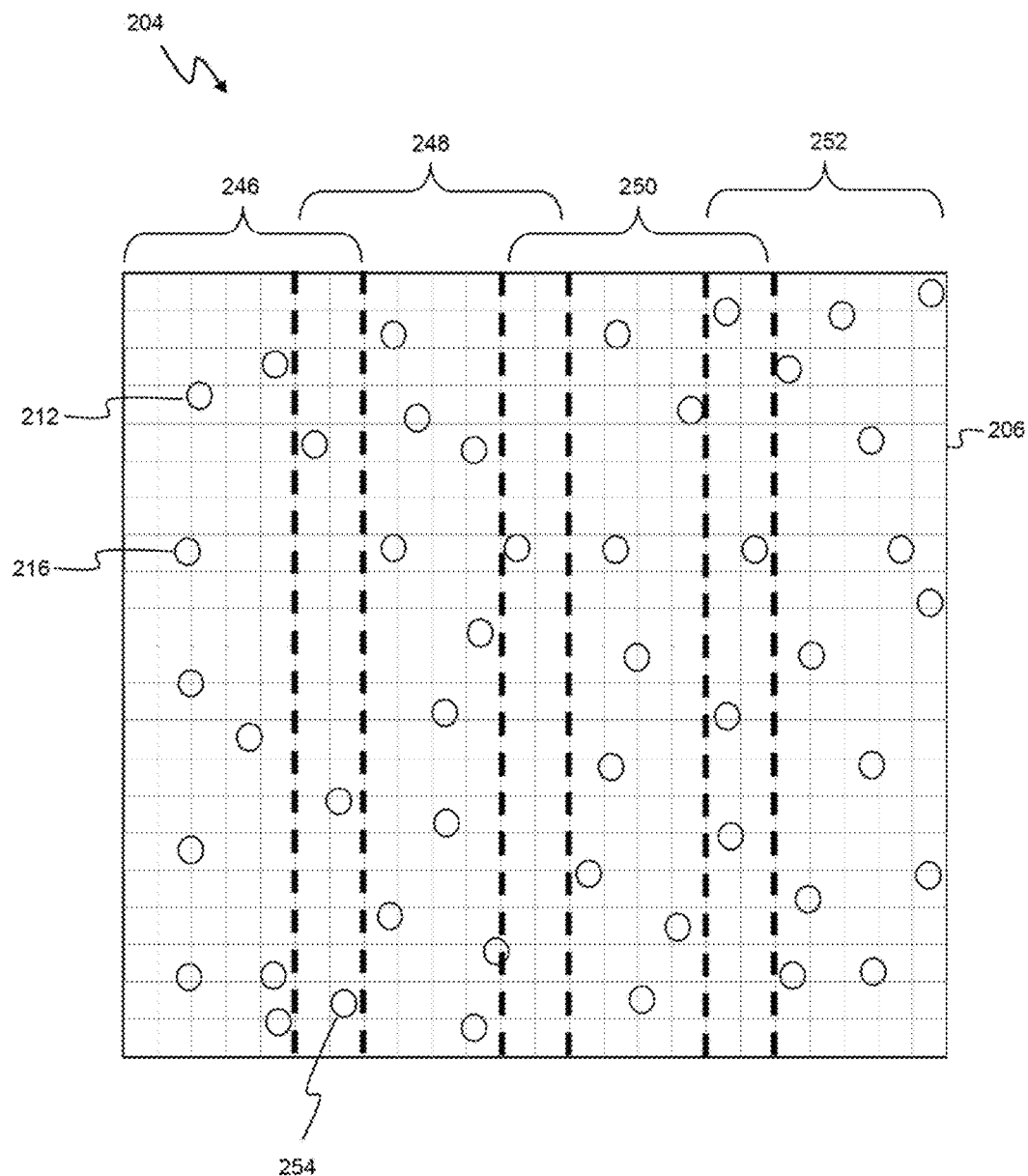
Figure 8:
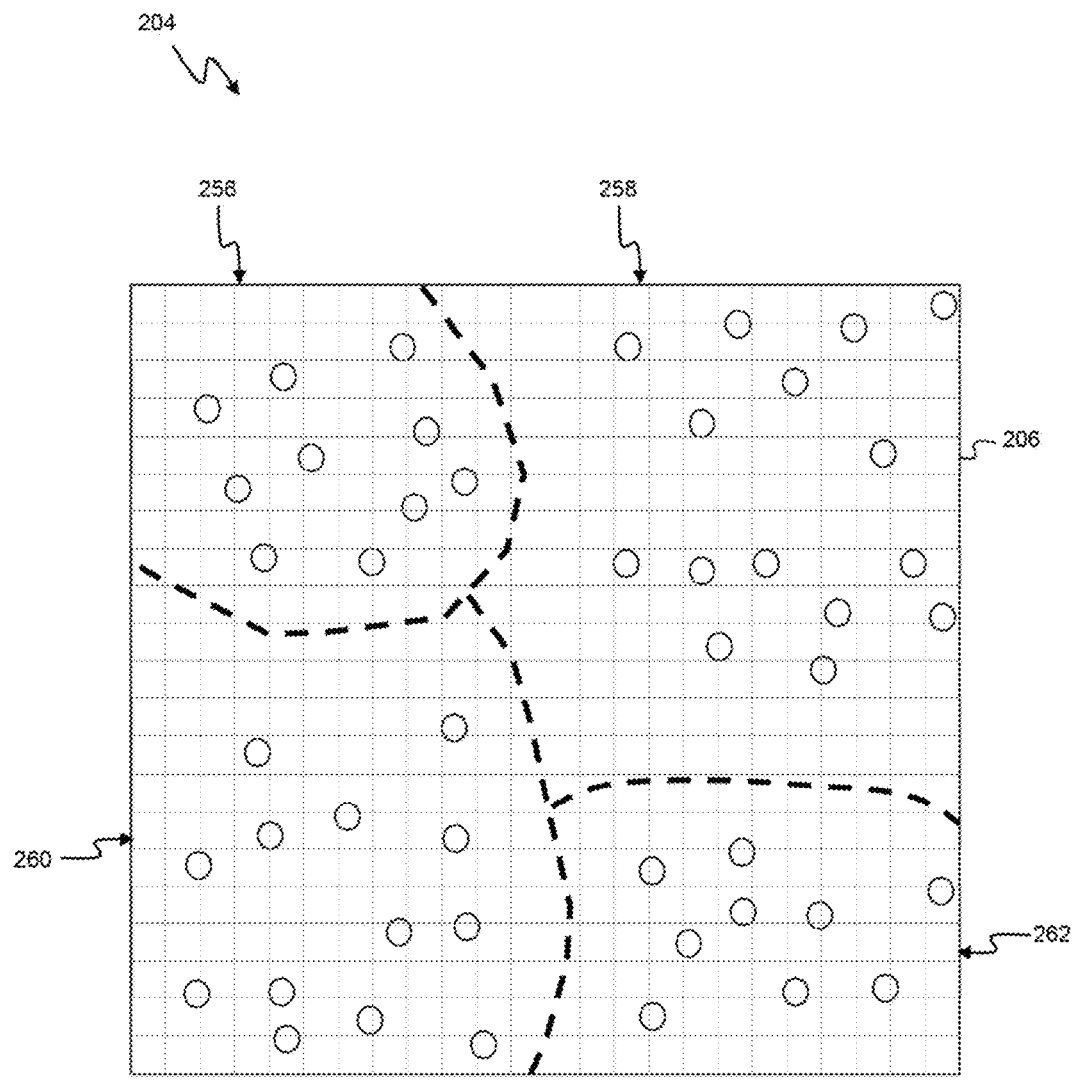

As a further example, FIG. 7 is a top view of the initial model 204 where the well field 206 has been divided into four regions 246, 248, 250, and 252. Like the regions shown in FIG. 6, the regions 246, 248, 250, and 252 are approximately rectangular in shape and subdivide the well field 206 into parallel strips. However, the regions 246, 248, 250, and 252 overlap such that wells may be included in two different regions. For example, well 254 is included in both region 246 and region 248. Thus, when the reservoir simulator 110 performs an optimization process for each of the regions separately, as described in more detail below, spatially-dependent parameters associated with well 254 will be included in the optimization calculations for both regions 246 and 248. In certain embodiments, when a well is disposed adjacent to a boundary between two regions, changing a spatially-dependent parameter of the well may have an effect on wells in a different region. The overlapping regions of FIG. 7 may somewhat negate this cross-region effect by ensuring near-boundary wells are included in optimization calculations for two adjacent regions. As a further example of the different types of regions the reservoir simulator 110 may create during block 230 of method 200, FIG. 8 is a top view of the initial model 204 where the well field 206 that has been divided into four regions 256, 258, 260, and 262. In the example of FIG. 8, the wells in well field 206 have been placed in different initial positions by the reservoir simulator 110 than the wells in the examples of FIGS. 4-7. Specifically, the wells in field 206 are clumped together in clusters. As such, changing a spatially-dependent parameter of a well in one cluster may have little or no effect on wells in another cluster. Accordingly, in the example of FIG. 8, the reservoir simulator 110 has created the regions 256, 258, 260, and 262 such that each contains a cluster of wells. One of ordinary skill would recognize that the regions shown in FIGS. 5-8 are simply examples and the well field 206 may be divided into regions in any number of additional and/or different shapes and sizes.

Figure 9:
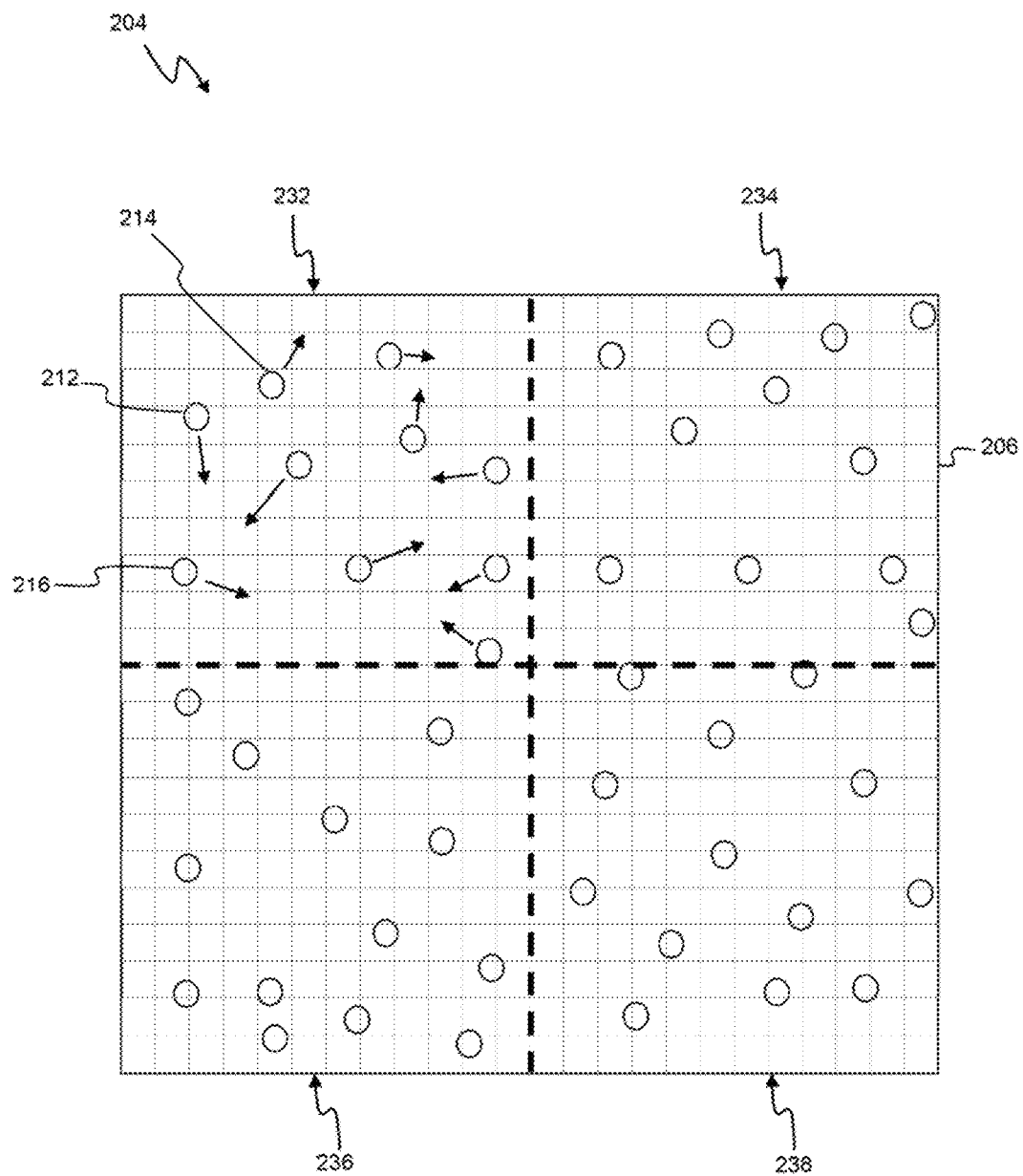
FIG. 9 is a top view of the initial model of FIG. 3 during an optimization process of one region in the well field according to aspects of the present disclosure.

Referring back to FIG. 2, after the reservoir simulator 110 divides a well field into a plurality of regions in block 230, the method 200 proceeds to block 280 where the reservoir simulator solves a spatially-dependent optimization problem for wells in one region out of the plurality of regions created in block 230. Specifically, to optimize a spatially-dependent parameter—such as well placement—for each well in a current region, the reservoir simulator 110 sets the parameters associated with the wells in the current region as variables to be solved for and sets the parameters associated with the wells in the other regions as constants equal to their initial value as defined in the initial model 204. In this regard, FIG. 9 is a top view of the initial model 204 during an optimization process. Specifically, FIG. 9 illustrates the optimization process described in block 280 as applied to the example optimization problem of maximizing hydrocarbon recovery by solving for optimal well placement. In more detail, rather than solving for well placement for all wells in the well field 206 simultaneously, the reservoir simulator solves for well placement for wells in each region separately. For example, if region 232 is the current region being optimized in block 280 of method 200, only the placement of wells in region 232 may be solved for during a full field optimization. That is, in block 280, the reservoir simulator 110 may determine the total hydrocarbon recovery for the entire well field over the course of many iterations but only optimize (i.e., adjust) the placement of the wells in region 232 while freezing the positions of the wells in the other regions. FIG. 9 illustrates the adjustment of the placement of wells 212, 214, and 216 in region 232. In certain embodiments, the reservoir simulator 110 may adjust the positions of the wells in region 232 to maximize recovery over the course of a pre-determined number iterations. In other embodiments, reservoir simulator 110 may adjust the positions of the wells in region 232 over the course of a dynamic number of iterations. For instance, the reservoir simulator may iterate over the optimization problem within a specific region until the calculated maximum hydrocarbon recovery fails to increase by a threshold amount after each iteration or a certain number of iterations. In alternative embodiments, the number of iterations performed for each region may be determined in a different manner.

Figure 10:
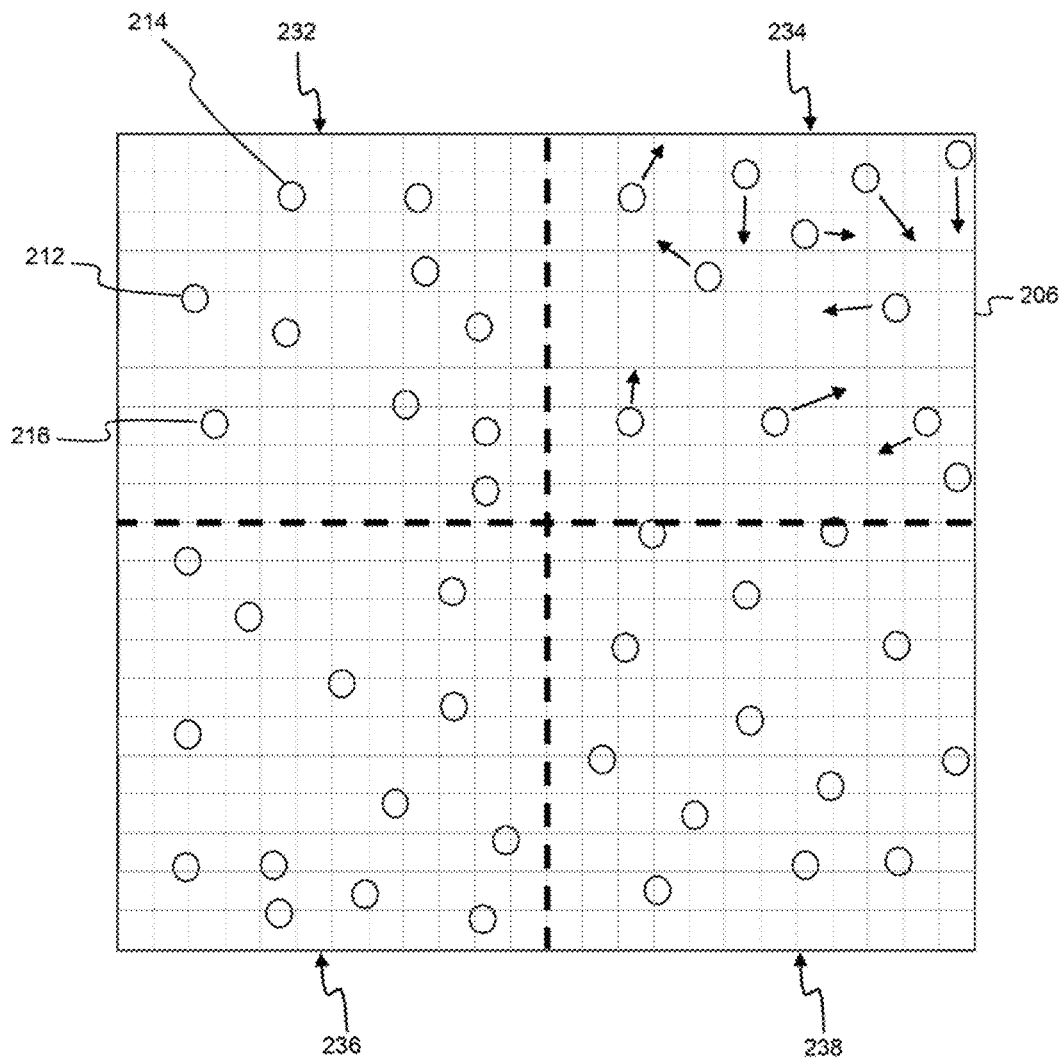
FIG. 10 is a top view of the initial model of FIG. 3 during an optimization process of another region in the well field according to aspects of the present disclosure.

Referring back to FIG. 2, after the reservoir simulator 110 has optimized the spatially-dependent parameter for the wells within region 232 in block 280, the method 200 proceeds to block 282 where the optimized value for each well as determined in block 280 is set as a constant for any subsequent optimizations in other regions. Next, in decision block 284, the reservoir simulator 110 determines if there are any remaining regions to optimize. If yes, the method 200 moves to block 286 where an un-optimized region is selected and then returns to block 280 where the reservoir simulator 110 solves the spatially-dependent optimization problem for wells in the new region selected in block 286. As an example of this, FIG. 10 is a top view of the well field 206 that shows the wells in region 234 undergoing the optimization process of maximizing hydrocarbon recovery by solving for optimal well placement. Notably, during this stage of method 200, only the wells in region 234 are iteratively adjusted while the wells in region 232 are frozen at the locations previously determined to be optimal for hydrocarbon recovery. For example, well 212 in region 232 is frozen at its post-optimized position within region 232 during the optimization of well placement in region 234. Thus, during each iteration of the optimization process shown in FIG. 10, the reservoir simulator will adjust the positions of the wells only in region 234 and calculate the predicted maximum recovery of the full field 206. In this manner, the method 200 sequentially optimizes and freezes the placement of the wells in each region in the well field 206.

In decision block 284, if all regions have been separately undergone the above optimization process, the method 200 may optionally proceed to block 288 where a full field optimization is performed. Specifically, in certain embodiments, the reservoir simulator 110 may solve the spatially-dependent optimization problem for all regions simultaneously after each region has been separately optimized. In this manner, the full field optimization in block 288 uses the post-optimized parameters for the wells in the well field 206 as a starting point and may improve the optimization results some additional amount. Further, this optional full field optimization may account for any cross-region effects generated by changes to spatially-dependent parameters associated with wells near the boundary between two regions.

Figure 11:
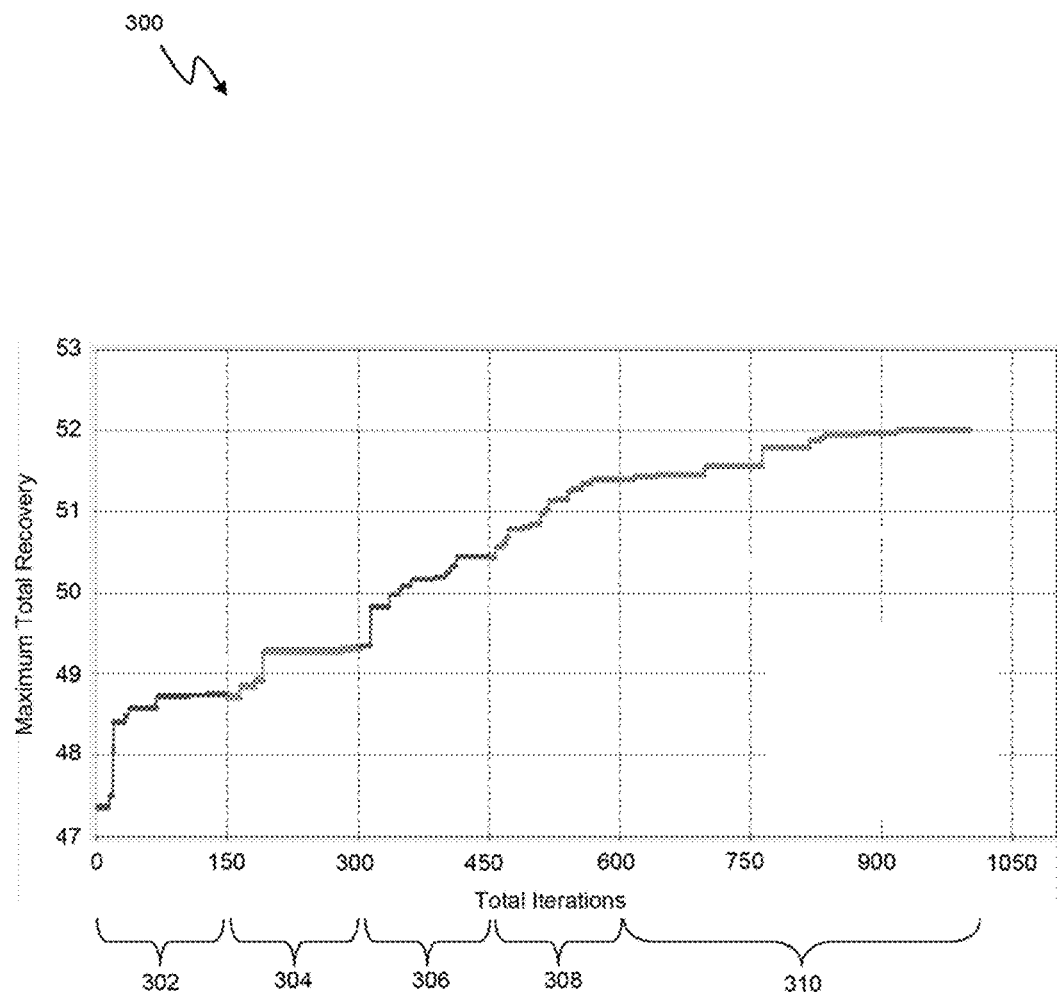
FIGS. 11-12 are example line graphs depicting the predicted maximum hydrocarbon recovery of the well field of FIG. 4 during different stages of the optimization procedure described in association with method of FIG. 2.

FIG. 11 is an example line graph 300 depicting the predicted maximum hydrocarbon recovery of the well field 206 during different stages of the example well placement optimization procedure described in association with method 200. Specifically, the y-axis of the line graph 200 represents maximum hydrocarbon recovery for the well field 206 and the x-axis represents the iterations performed during the optimization procedure. In more detail, after the reservoir simulator 110 optimizes well placement of wells within a specific region, the predicted maximum recovery of the well field 206 may be improved over the recovery predicted for the wells as initially located in the initial model 204. As shown in FIG. 11, a first segment 302 of the line graph 300 depicts the maximum recovery of the well field 206 during the optimization of the wells in the region 232 (FIG. 9). During the optimization of the wells in region 232, the locations of the wells are adjusted over the course of 150 iterations and, as a result, the maximum recovery improves from about 47.5% to about 48.8%. A next segment 304 depicts the maximum recovery of the well field 206 during the optimization of well placement of the wells in the next region 234 (FIG. 10). Over the course of another 150 iterations, the optimization of well placement of the wells in region 234 results in about an additional 0.5% recovery improvement. Additionally, segments 306 and 308 represent the improvement in maximum recovery due to the separate optimizations of regions 236 and 238 in well field 206. A further segment 306 depicts the maximum recovery of the well field 206 during a full field optimization performed subsequent to each region being optimized separately. Over the course of about 400 iterations, a full field optimization using each of the separately-optimized regions as a base provides about an additional 0.5% improvement in maximum recovery in well field 206.

Figure 12:
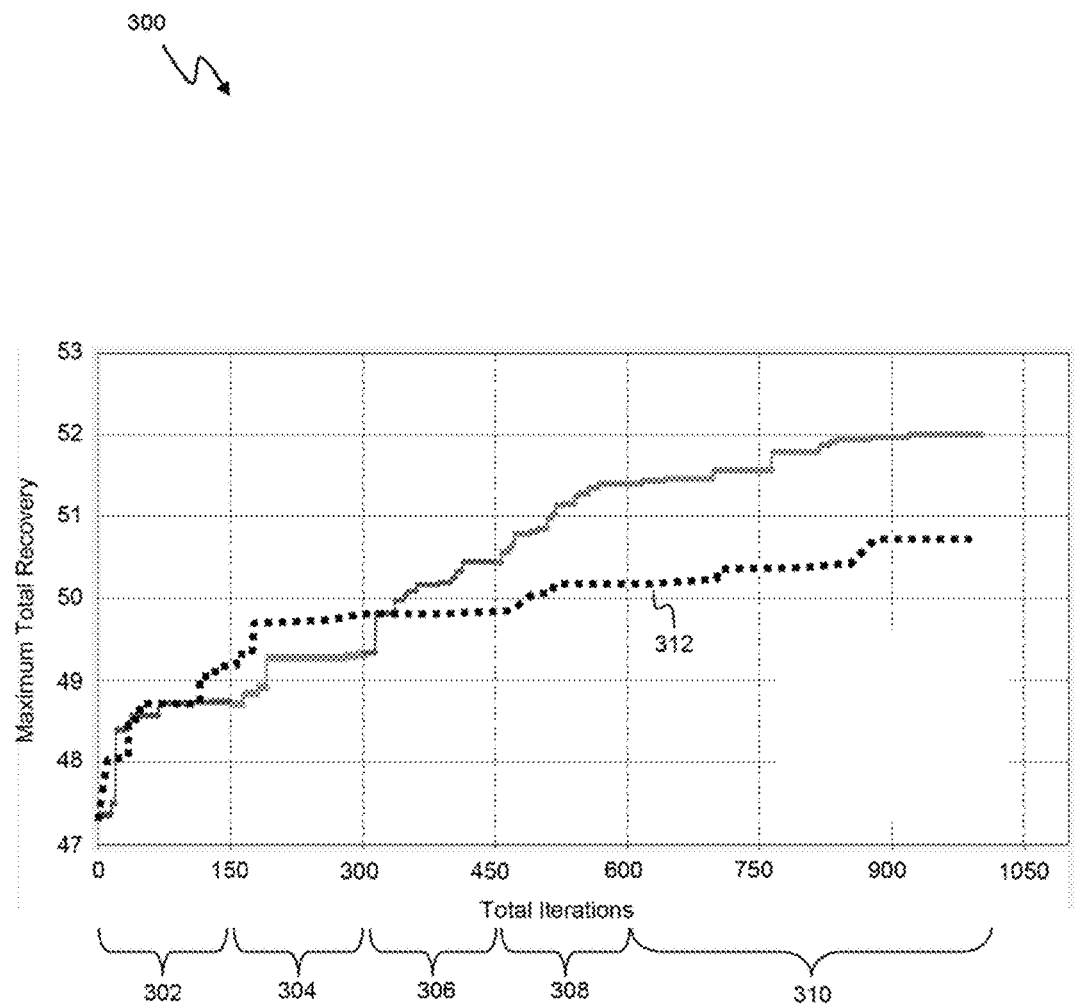

In certain optimization scenarios, optimizing each region separately before performing a full field optimization may provide better maximum recovery than simply performing a full-field optimization alone. In that regard, FIG. 12 depicts the line graph 300 of FIG. 11 but includes an additional data line 312 representing the maximum recovery of the well field 206 during a simultaneous full-field optimization that uses the initial model 204 as a starting point. As shown in example of FIG. 12, the maximum recovery of the field 206 is greater after the optimization of each of the four fields separately (i.e., after 600 iterations) than the maximum recovery after 1000 iterations of full field optimization starting with the initial model 204. One of ordinary skill in the art would recognize that the line graph 300 shown in FIGS. 11 and 12 is simply an example of optimizing a specific spatially-dependent parameter (i.e., well placement) and different reservoir simulation optimization scenarios may produce different optimization results.

Further, although the example optimization problem of maximizing hydrocarbon recovery by optimizing well placement was utilized to describe various steps of method 200, one of ordinary skill in the art will recognize that the method 200 may be utilized to more efficiently solve any number of optimization problems involving spatially-dependent attributes. For example, the method 200 may be utilized to adjust a spatially-dependent simulation parameter, such as porosity, in the vicinity of each well such that simulation results match historical injection and production results (i.e., history matching). In such a scenario, the reservoir simulator 110 may iteratively adjust the porosity associated with the wells in each of regions 232 234, 236, and 238 separately. And when the porosity values in one region are being adjusted to match historical values, the porosity values in the other regions may be held constant.

Additionally, it is understood that method 200 of sequentially optimizing spatially-dependent well-field attributes in a reservoir simulation is simply an example embodiment, and in alternative embodiments, additional and/or different steps may be included in the method. For example, in certain embodiments, after a well field has been divided into multiple regions each containing a subset of wells in block 230, the reservoir simulator 110 may concurrently run optimization processes on multiple regions. For instance, because each region generally contains wells having spatially-independent parameters with respect to other regions (i.e., a change to a parameter associated with a well in one region has very little affect on wells in other far away regions), the reservoir simulator may treat the optimization in one region and the optimization in a separate region as a different optimization objectives. Accordingly, the parameter associated with wells in two different regions may be concurrently and independently iteratively optimized. In certain embodiments, regions that are concurrently optimized may be non-contiguous. In the context of the example optimization problem of maximizing hydrocarbon recovery by optimizing well placement, the reservoir simulator may concurrently and independently adjust the placement of wells in regions 240 and 244 in well field 206 (FIG. 6). After well locations for optimal hydrocarbon recovery are determined for regions 240 and 244, the reservoir simulator 100 may set the new well locations in these regions as constants and then concurrently and independently iteratively adjust the placement of wells in regions 242 and 246. In this manner, optimization problems involving spatially-dependent parameters may be partially performed in parallel to improve efficiency and results.

The foregoing methods and systems described herein are particularly useful in creating and executing a plan to develop a reservoir. First a reservoir is modeled as described herein to design a well completion plan for a well. In an embodiment, the drilling well completion plan includes the selection of proposed wellbores in a formation. The well completion plan may further include a fracturing plan, which may include the selection of fracture zones and their positioning, fracturing fluids, proppants and fracturing pressures. In other embodiments, the drilling well completion plan may include selecting a particular trajectory of the wellbore or selecting a desired wellbore pressure to facilitate mass transfer and fluid flow to the wellbore. The reservoir simulator may then be run to model reservoir production over a period of time utilizing virtual wells. In certain embodiments, the well completion plan may be optimized by the previously-described sequential method for optimization of spatially-dependent parameters. For example, a reservoir simulator may be employed to divide an initial model of a reservoir into regions so that a spatially-dependent parameter such as wellbore location, wellbore trajectory, or wellbore pressure may be independently and separately optimized for virtual wellbores in each region of the initial model. Based on the optimized model, a drilling plan may be implemented and physical wellbores drilled in accordance with the plan.

In a further exemplary aspect, the present disclosure is directed to a method for drilling a wellbore in reservoir. The method includes utilizing the reservoir simulation system of the invention and as described herein to model reservoir flow and develop a drilling plan using a sequential optimization process. Once reservoir flow has been modeled and optimized, the method includes preparing equipment to construct a portion of a wellbore in accordance with the drilling plan, initiating drilling of the wellbore and thereafter, drilling a wellbore in accordance with the drilling plan.

While the reservoir simulation system has been described in the context of subsurface modeling, it is intended that the simulator and system described herein can also model surface and subsurface coupled together. A non-limiting example of such a simulator is the modeling of fluid flow in a surface network consisting of flowlines, pipelines, pumps, and equipment such as pumps, compressors, valves, etc coupled with the well and the reservoir together as an integrated flow network or system. In such a case, the placement or operating characteristics of surface network elements may be optimized using the sequential process described in association with method 200 of FIG. 2.

While the reservoir simulation system has been described primarily in terms of flow through a network that may consist of a field, a partial field, a well, multiple wells, and pipeline, or any portion thereof, it will be appreciated that the reservoir simulation system described herein may be implemented for mapping reservoirs to a grid and analysis of grid properties, such as pressures, saturations, relative permeability, etc at a plurality of grid cell at a plurality of time steps. In any event, the output from such reservoir simulation systems may be two dimensional or three dimensional grids, tables or two dimensional plots of data. For example, a two dimensional plot may illustrate production rate of oil (STB/D) over a period of time. Likewise, a three dimensional plot may illustrate water saturation of a field over a period of time.

In one exemplary aspect, the present disclosure is directed to a computer-implemented method of solving a reservoir simulation optimization problem. The method includes creating an initial model of a well field having a plurality of wells, each well being associated with a spatially-dependent parameter and dividing the well field into first and second regions, the first region including a first subset of the plurality of wells and the second region including a second subset of the plurality of wells. The method also includes solving for the parameters associated with the wells in the first subset to get a first set of values while holding constant the parameters associated with the wells in the second subset and setting the parameters associated with the wells in the first subset to the first set of values. Further, the method includes solving for the parameters associated with the wells in the second subset to get a second set of values while holding constant the parameters associated with the wells in the first subset.

In another exemplary aspect, the present disclosure is directed to a computer-implemented method of solving a reservoir simulation optimization problem. The method includes creating an initial model of a well field having a plurality of wells, each well being associated with a spatially-dependent parameter and dividing the well field into a plurality of regions, each region in the plurality of regions including a subset of the plurality of wells. The method also includes iteratively solving for the parameters associated with the wells in a first region in the plurality of regions to get an optimal set of values while holding constant the parameters associated with the wells in the other regions in the plurality of wells and setting the parameters associated with the wells in the first region to the optimal set of values. Further, the method includes repeating the iteratively solving and the setting for each region in the plurality of regions and, after the repeating, iteratively solving for the parameters associated with the wells in every region in the plurality of regions simultaneously.

In yet another exemplary aspect, the present disclosure is directed to computer-implemented reservoir simulator. The system includes a processor, a non-transitory storage medium accessible by the processor, and software instructions stored on the storage medium. The software instructions are executable by the processor for creating an initial model of a well field having a plurality of wells, each well being associated with a spatially-dependent parameter and dividing the well field into first and second regions, the first region including a first subset of the plurality of wells and the second region including a second subset of the plurality of wells. The software instructions are executable by the processor for solving for the parameters associated with the wells in the first subset to get a first set of values while holding constant the parameters associated with the wells in the second subset and setting the parameters associated with the wells in the first subset to the first set of values. Further, the software instructions are executable by the processor for solving for the parameters associated with the wells in the second subset to get a second set of values while holding constant the parameters associated with the wells in the first subset.

In a further another exemplary aspect, the present disclosure is directed to a method for drilling wellbores in a reservoir. The method includes creating an initial model of the reservoir having a plurality of virtual wellbores, each virtual wellbore being associated with a spatially-dependent parameter and dividing the initial model into first and second regions, the first region including a first subset of the plurality of virtual wellbores and the second region including a second subset of the plurality of virtual wellbores. The method also includes solving for the parameters associated with the virtual wellbores in the first subset to get a first set of values while holding constant the parameters associated with the virtual wellbores in the second subset and setting the parameters associated with the virtual wellbores in the first subset to the first set of values. Further, the method includes solving for the parameters associated with the virtual wellbores in the second subset to get a second set of values while holding constant the parameters associated with the virtual wellbores in the first subset and based on the first and second sets of values, selecting a position and trajectory for a plurality of physical wellbores in the reservoir. Finally, the method includes preparing equipment to construct a portion of the plurality of physical wellbores and drilling the plurality of physical wellbores in accordance with the selected trajectory.

While certain features and embodiments of the disclosure have been described in detail herein, it will be readily understood that the disclosure encompasses all modifications and enhancements within the scope and spirit of the following claims. Furthermore, no limitations are intended in the details of construction or design herein shown, other than as described in the claims below. Moreover, those skilled in the art will appreciate that description of various components as being oriented vertically or horizontally are not intended as limitations, but are provided for the convenience of describing the disclosure.

It is therefore evident that the particular illustrative embodiments disclosed above may be altered or modified and all such variations are considered within the scope and spirit of the present disclosure. Also, the terms in the claims have their plain, ordinary meaning unless otherwise explicitly and clearly defined by the patentee.

What is claimed is:

1. A computer-implemented method to improve hydrocarbon recovery of wellbores in a reservoir, the method comprising:
    creating an initial model of a well field having a plurality of wells, each well being associated with a spatially-dependent parameter that corresponds to a first hydrocarbon recovery;
    dividing the well field into first and second regions, the first region including a first subset of the plurality of wells and the second region including a second subset of the plurality of wells;
    solving for the parameters associated with the wells in the first subset to get a first set of values while holding constant the parameters associated with the wells in the second subset;
    setting the parameters associated with the wells in the first subset to the first set of values;
    solving for the parameters associated with the wells in the second subset to get a second set of values while holding constant the parameters associated with the wells in the first subset,
    wherein the first and second set of values correspond to parameters predicted to produce a second hydrocarbon recovery that is improved over the first hydrocarbon recovery;
    using the first and second sets of values, designing a well completion plan that corresponds to the second hydrocarbon recovery; and
    completing a well field according to the well completion plan.

2. The method of claim 1, further including:
    setting the parameters associated with the wells in the second subset to the second set of values; and
    simultaneously solving for the parameters associated with the wells in the first subset and the parameters associated with the wells in the second subset.

3. The method of claim 1,
    wherein the spatially-dependent parameter is a geographical location of a well; and
    wherein the first set of values includes geographical locations of the wells in the first subset that increase recovery of hydrocarbons from the well field.

4. The method of claim 1,
    wherein the spatially-dependent parameter is a characteristic of the well field in a vicinity of each well in the plurality of wells; and
    wherein the first set of values includes values of the characteristic that match simulated production of the wells to historical production of the wells.

5. The method of claim 1, wherein the dividing includes sizing the first and second regions based on the strength of the spatial dependence of the parameter.

6. The method of claim 1, wherein the first and second regions overlap such that one of the plurality of wells may be included in the first subset and also the second subset.

7. The method of claim 1, wherein the dividing includes dividing the well field into one of a plurality of parallel strips and a plurality of quadrants.

8. The method of claim 1, wherein the solving for the parameters associated with the wells in the first subset includes solving for the parameters over the course of a number of iterations.

9. The method of claim 8, wherein the number of iterations is pre-determined.

10. The method of claim 8, wherein the number of iterations is dynamic.

11. The method of claim 10, wherein the solving is performed until the first set of values fails to change by a threshold amount after each iteration.

12. The method of claim 1,
    wherein the dividing includes dividing the well field into the first and second regions and a third region, the third region including a third subset of the plurality of wells;
    including solving for the parameters associated with the wells in the third subset to get a third set of values concurrently with the solving for the parameters associated with the wells in the first subset;
    including setting the parameters associated with the wells in the third subset to the third set of values; and
    wherein solving for the parameters associated with the wells in the second subset includes holding constant the parameters associated with the wells in the third subset.

13. The method of claim 12, wherein the first region and the third region are non-contiguous.

14. A computer-implemented method to improve hydrocarbon recovery of wellbores in a reservoir, the method comprising:
    creating an initial model of a well field having a plurality of wells, each well being associated with a spatially-dependent parameter that corresponds to a first hydrocarbon recovery;
    dividing the well field into a plurality of regions, each region in the plurality of regions including a subset of the plurality of wells;
    iteratively solving for the parameters associated with the wells in a first region in the plurality of regions to get an optimal set of values while holding constant the parameters associated with the wells in the other regions in the plurality of wells,
    wherein the optimal set of values correspond to parameters predicted to produce a second hydrocarbon recovery that is improved over the first hydrocarbon recovery;
    setting the parameters associated with the wells in the first region to the optimal set of values;
    thereafter repeating the iteratively solving and the setting for each region in the plurality of regions;
    after the repeating, iteratively solving for the parameters associated with the wells in every region in the plurality of regions simultaneously;
    using the parameters, designing a well completion plan that at least corresponds to the second hydrocarbon recovery; and
    completing a well field according to the well completion plan.

15. The method of claim 14,
    wherein the spatially-dependent parameter is a geographical location of a well; and wherein the optimal set of values includes geographical locations of the wells in the first region that increase recovery of hydrocarbons from the well field.

16. The method of claim 14, wherein the dividing includes sizing each of the regions in the plurality of regions based on the strength of the spatial dependence of the parameter.

17. The method of claim 14, wherein the dividing includes dividing the well field into one of a plurality of parallel strips and a plurality of quadrants.

18. The method of claim 14, wherein the iteratively solving includes solving for the parameters a dynamic number of times.

19. A computer-implemented reservoir simulator to improve hydrocarbon recovery of wellbores in a reservoir, the system comprising:
a processor;
a non-transitory storage medium accessible by the processor; and
software instructions stored on the storage medium and executable by the processor for:
creating an initial model of a well field having a plurality of wells, each well being associated with a spatially-dependent parameter that corresponds to a first hydrocarbon recovery;
dividing the well field into first and second regions, the first region including a first subset of the plurality of wells and the second region including a second subset of the plurality of wells;
solving for the parameters associated with the wells in the first subset to get a first set of values while holding constant the parameters associated with the wells in the second subset;
setting the parameters associated with the wells in the first subset to the first set of values;
solving for the parameters associated with the wells in the second subset to get a second set of values while holding constant the parameters associated with the wells in the first subset,
wherein the first and second sets of values correspond to parameters which are predicted to produce a second hydrocarbon recovery that is improved over the first hydrocarbon recovery;
using the first and second sets of values, designing a well completion plan that corresponds to the second hydrocarbon recovery; and
completing a well field according to the well completion plan.

20. The computer-implemented reservoir simulator of claim 19, further including: setting the parameters associated with the wells in the second subset to the second set of values; and simultaneously solving for the parameters associated with the wells in the first subset and the parameters associated with the wells in the second subset.

21. The computer-implemented reservoir simulator of claim 19, wherein the spatially-dependent parameter is a geographical location of a well; and wherein the first set of values includes geographical locations of the wells in the first subset that increase recovery of hydrocarbons from the well field.

22. The computer-implemented reservoir simulator of claim 19, wherein the solving for the parameters associated with the wells in the first subset includes solving over the course of a number of iterations.

23. A method to improve hydrocarbon recovery of wellbores in a reservoir, the method comprising:
creating an initial model of the reservoir having a plurality of virtual wellbores, each virtual wellbore being associated with a spatially-dependent parameter that corresponds to a first hydrocarbon recovery, the parameter being at least one of a position or trajectory of the virtual wellbores;
dividing the initial model into first and second regions, the first region including a first subset of the plurality of virtual wellbores and the second region including a second subset of the plurality of virtual wellbores;
solving for the parameters associated with the virtual wellbores in the first subset to get a first set of values while holding constant the parameters associated with the virtual wellbores in the second subset;
setting the parameters associated with the virtual wellbores in the first subset to the first set of values;
solving for the parameters associated with the virtual wellbores in the second subset to get a second set of values while holding constant the parameters associated with the virtual wellbores in the first subset,
wherein the first and second sets of values correspond to at least one of a position or trajectory of the virtual wellbores which are predicted to produce a second hydrocarbon recovery that is improved over the first hydrocarbon recovery;
based on the first and second sets of values, selecting a position and trajectory for a plurality of physical wellbores in the reservoir, wherein the selected position and trajectory corresponds to the second hydrocarbon recovery;
preparing equipment to construct a portion of the plurality of physical wellbores in accordance with the selected position and trajectory; and
drilling the plurality of physical wellbores in accordance with the selected position and trajectory.

24. The method of claim 23,
wherein the spatially-dependent parameter is a geographical location of a virtual wellbore; and
wherein the first and second sets of values include geographical locations of the virtual wellbores in the first and second subsets that increase simulated recovery of hydrocarbons from the initial model of the reservoir.

* * * * *